United States Patent
Suzuki

(10) Patent No.: US 6,906,525 B2
(45) Date of Patent: Jun. 14, 2005

(54) GROUND DETECTION APPARATUS FOR ELECTRIC VEHICLE

(75) Inventor: Kouhei Suzuki, Tokyo (JP)

(73) Assignee: Nissan Motor Co., Ltd., Kanagawa-ken (JP)

(*) Notice: Subject to any disclaimer, the term of this patent is extended or adjusted under 35 U.S.C. 154(b) by 63 days.

(21) Appl. No.: 10/036,373

(22) Filed: Jan. 7, 2002

(65) Prior Publication Data

US 2002/0121902 A1 Sep. 5, 2002

(30) Foreign Application Priority Data

Jan. 11, 2001 (JP) ..................................... P2001-004120

(51) Int. Cl.[7] ............................................. G01R 31/14
(52) U.S. Cl. ...................... 324/509; 324/510; 324/551
(58) Field of Search ............................... 324/503, 509, 324/510, 551, 76.11

(56) References Cited

U.S. PATENT DOCUMENTS

| | | | | |
|---|---|---|---|---|
| 4,253,056 A | * | 2/1981 | Chaudhary | 324/509 |
| 5,530,363 A | * | 6/1996 | Gaughan et al. | 324/509 |
| 5,818,236 A | * | 10/1998 | Sone et al. | 324/509 |
| 6,320,389 B1 | * | 11/2001 | Tamesue et al. | 324/509 |
| 6,555,988 B2 | * | 4/2003 | Masaki et al. | 318/721 |

* cited by examiner

Primary Examiner—Anjan Deb
Assistant Examiner—Timothy J. Dole
(74) Attorney, Agent, or Firm—McDermott Will & Emery LLP

(57) ABSTRACT

A ground detection apparatus for electric automobile having a high-voltage DC power supply (31) which is electrically insulated from a body and a three-phase AC motor (33) which is driven by a DC voltage from the high-voltage DC power supply. A ground detection signal consisting of a square waveform is supplied to the DC power supply circuit through a detection resistor and a coupling capacitor, a voltage amplitude of a ground detection point serving as a connection point between the detection resistor (3) and the coupling capacitor (4) is detected, the detected voltage amplitude is converted into an insulation resistance on the basis of the relationship between a preset voltage amplitude and a preset insulation resistance, and levels of insulation resistance deterioration of the high-voltage DC power supply are detected by comparing the converted insulation resistance with a preset ground decision threshold value.

8 Claims, 6 Drawing Sheets

GROUND DETECTION APPARATUS FOR ELECTRIC VEHICLE

BACKGROUND OF THE INVENTION

1. Field of the Invention

The present invention relates to a ground detection apparatus for detecting the ground of a high-voltage DC power supply mounted on an electric vehicle.

2. Description of the Related Art

In an electric vehicle such as an electric automobile or a hybrid electric automobile, in general, a high-voltage DC current connected to a high-voltage battery is electrically insulated from a vehicle electrical circuit connected to a body of vehicle. For this reason, a ground detection apparatus is arranged for generating a warning when dielectric breakdown occurs between the high-voltage circuit and the body to decrease an insulation resistance to generate ground.

An example of a ground detection apparatus for conventional electric vehicle will be described below. In FIG. 1, reference numeral 110 denotes a traveling drive circuit system, reference numeral 51 denotes a battery group arranged as a high-voltage DC power supply (e.g., 200 to 300 V) and electrically insulated from a body B.

Reference numeral 52 denotes an inverter as a DC-AC converter, reference numeral 53 denotes a three-phase AC motor for vehicle traveling, reference numeral 54 denotes a plus bus serving as a DC positive electrode feeder extending from the battery group 51 to the inverter 52, reference numeral 55 denotes a minus bus serving as a DC negative electrode feeder extending from the battery group 51 to the inverter 52, and reference numerals 56, 57, and 58 denote an U-phase line, a V-phase line, and a W-phase line which are AC feeders extending from the inverter 52 to the AC motor 53, respectively.

A conventional ground detection apparatus 100 shown in FIG. 1 is to detect the ground to the body B in the traveling drive circuit system 110, and is constituted by an oscillation circuit 60 and a detection unit 80 for detecting a change in voltage level.

A connection point P between the oscillation circuit 60 and the detection unit 80 is connected to the plus bus 54 of the battery group 51 of the traveling drive circuit system 110 through a coupling capacitor 70A, and a DC component is isolated.

The oscillation circuit 60 comprises an oscillator 61 in which a multi-vibrator is formed by an operational amplifier or the like to generate a square wave having a predetermined frequency, an impedance converter/buffer 62 which is arranged to prevent the oscillation frequency of the oscillator 61 from being changed when a load impedance changes in generation of ground in the traveling drive circuit system 110, and a detection resistor 63 connected between the output stage of the impedance converter 62 and the coupling capacitor 70A. Reference numerals 65 and 66 denote protecting diodes for protecting the impedance converter 62 from a backward voltage or an overvoltage in generation of ground.

In the detection unit 80, a comparator 81 for comparing a voltage level of the connection point P between the detection resistor 63 and the coupling capacitor 70A at which an AC signal output of the oscillation circuit 60 appears with a reference voltage. The connection point P is connected to an inverted input terminal. To a non-inverted input terminal of the comparator 81, a reference voltage circuit is connected, where the reference voltage thereof is set by partial-voltage resistors 88 and 89.

A smoothing circuit 86 in which a time constant is set by a resistor 84 and a capacitor 85 is arranged at the output terminal of the comparator 81. An output from the comparator 81 is inputted to a non-inverted input terminal of a comparator 87 of the output stage through the resistor 84 of the smoothing circuit 86.

The time constant of the smoothing circuit 86 is set such that a smoothing voltage is lower than a reference voltage when an output from the comparator 81 is a duty ratio of 50%, and the smoothing voltage is higher than the reference voltage when an output from the comparator 81 is a duty ratio of 100%.

A reference voltage circuit for setting a reference voltage set by partial-voltage resistors 93 and 94 depending on the smoothing voltage of the smoothing circuit 86 is connected to the inverted input terminal of the comparator 87.

In the ground detection apparatus 100, reference numerals 91 and 92 denotes protecting diodes for protecting the comparator 81 from a backward voltage or an overvoltage in generation of ground.

SUMMARY OF THE INVENTION

However, the conventional ground detection apparatus has the following problems. The conventional ground detection apparatus has the following configuration. That is, a voltage detected at a ground detection point P by the comparators is compared with a threshold voltage of a decrease in insulation resistance which is determined by a circuit constant in advance to detect the presence/absence of ground in the high-voltage DC power supply. For this reason, in order to detect the decrease in insulation resistance in several levels, comparators, the number of which is equal to the number of levels of the decrease in insulation resistance, for comparing threshold values of the decrease in insulation resistance set in advance must be arranged. In order to generate warnings depending on the several levels of the decrease in insulation resistance, warning signal generation circuits, the number of which is equal to the number of levels of the decrease in insulation resistance, are required, the circuit configuration is disadvantageously complicated.

When ground is generated in the battery group, and when the peak value at the ground detection point P changes, the peak value is converted into an effective value. The converted effective value and the threshold value (or a reference voltage) of the decrease in insulation resistance determined by a circuit constant in advance are compared with each other by the comparator to detect insulation resistance levels. For this reason, an error generated by the effective value conversion is superposed on an error of the reference voltage of the insulation resistance levels generated by the circuit constant, so that levels of the decrease in insulation resistance cannot be detected at a high precision disadvantageously.

Therefore, according to the present invention, there is provided a ground detection apparatus for vehicle in which the circuit configuration can be simplified without increase in the numbers of comparators, warning signal lines, and the like unlike the related art, and the levels of the decrease in insulation resistance of a DC voltage circuit with respect to a body can be detected at a high precision in a plurality of stages. The present invention provides ground detection apparatus for vehicle, which can detect the presence/absence of an abnormal waveform of a ground detection signal.

According to the first technical aspect of the present invention, there is provided a ground detection apparatus for electric vehicle including a DC power supply circuit which is electrically insulated from a body and an AC circuit which is driven by a DC voltage from the DC power supply circuit, wherein a ground detection signal consisting of a periodical waveform is supplied to the DC power supply circuit through a detection resistor and a coupling capacitor, a voltage amplitude of a ground detection point serving as a connection point between the detection resistor and the coupling capacitor is detected, the detected voltage amplitude is converted into an insulation resistance on the basis of the relationship between a preset voltage amplitude and a preset insulation resistance, and levels of insulation resistance deterioration of the DC power supply circuit are detected by comparing the converted insulation resistance with a preset ground decision threshold value.

According to the second technical aspect of the present invention, the ground detection apparatus, furthermore, performs sampling of voltages at a sampling period which is ½ the period of the periodical waveform to detect the voltages, and calculates a difference between a first voltage detected by the odd-numbered sampling in the sampling period and a second voltage detected by the even-numbered sampling in the sampling period as the voltage amplitude.

According to the third technical aspect of the present invention, there is provided a ground detection method for electric vehicle having a DC power supply circuit electrically insulated from a body, the apparatus is coupled to the DC power supply circuit through a coupling capacitor, includes the following steps. More specifically, a ground detection signal consisting of a periodical waveform is output to one terminal of the coupling capacitor through a resistor, the voltage of one terminal of the coupling capacitor is detected, on the basis of the relationship between a preset voltage amplitude and an insulation resistance, the detected voltage amplitude is converted into the insulation resistance, and levels of insulation resistance deterioration of the DC power supply circuit are detected by comparing the converted insulation resistance with a preset ground decision threshold value.

DESCRIPTION OF THE PREFERRED EMBODIMENT

Figure 1:
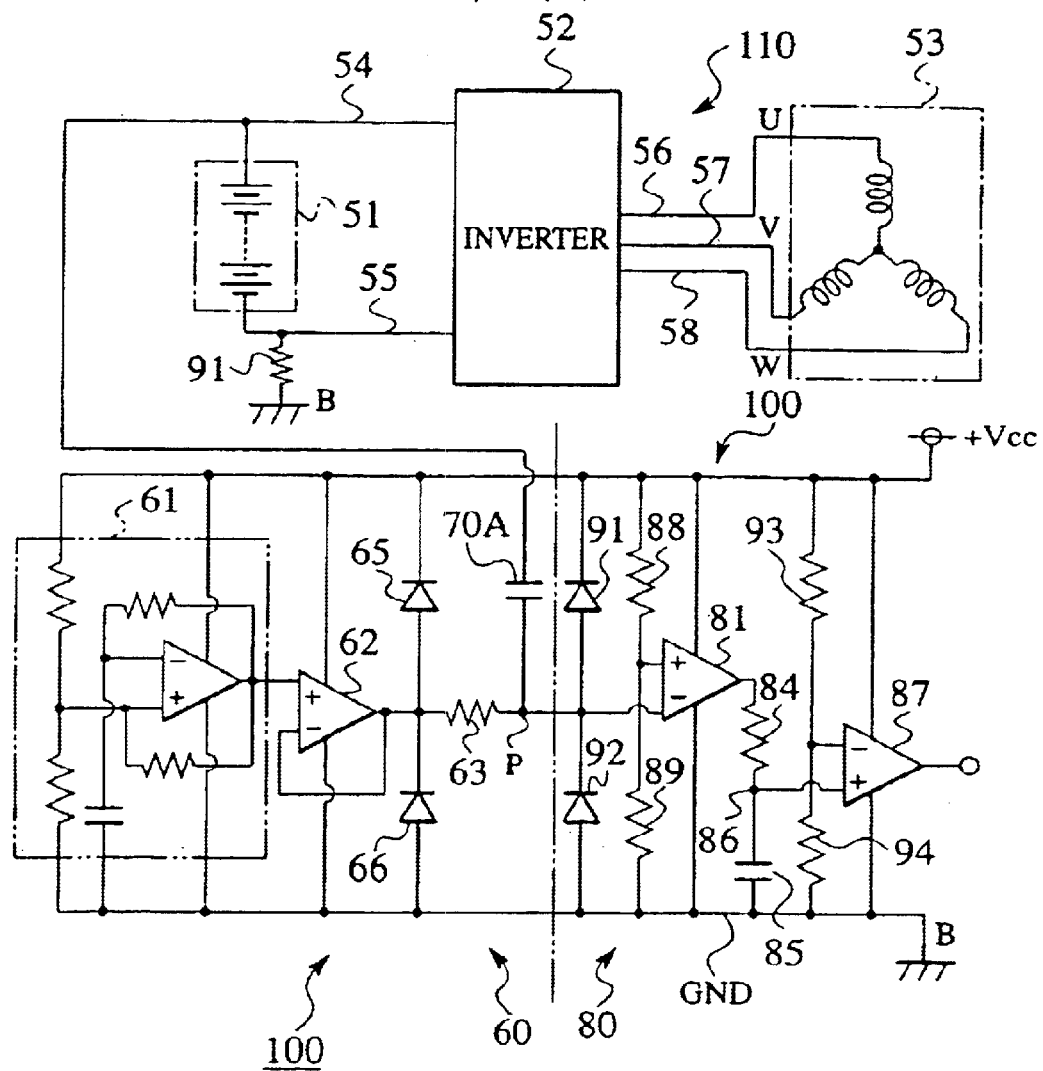
FIG. 1 is a circuit diagram of a related ground detection apparatus.
Figure 2:
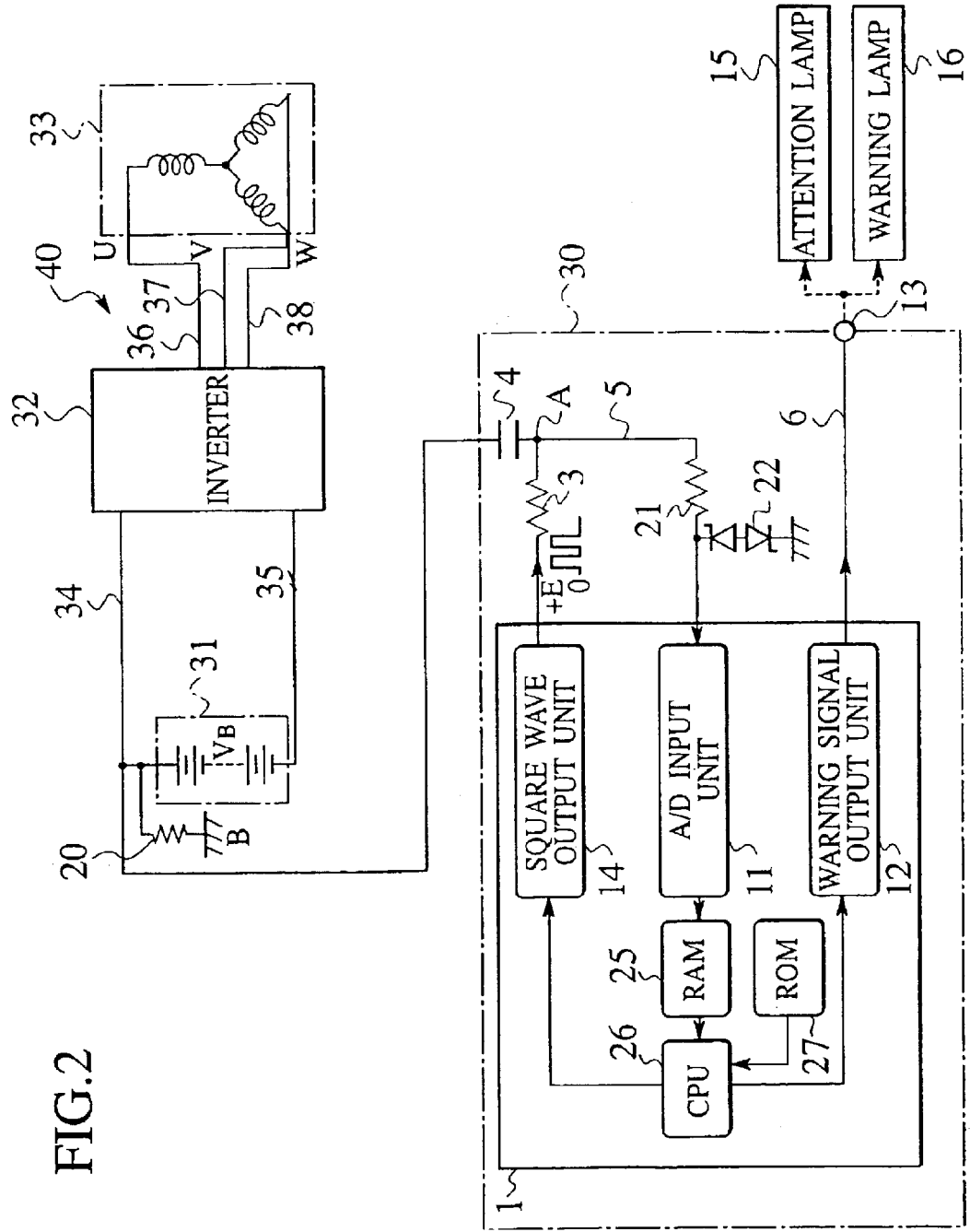
FIG. 2 is a diagram for explaining the ground detection apparatus for vehicle and a traveling drive circuit system according to one embodiment of the present invention.

Embodiments of a ground detection potential of a vehicle according to the present invention will be described below. FIG. 2 is a circuit diagram for explaining the configuration of a ground detection apparatus 30 and a traveling drive circuit system 40 of an electric vehicle according to one embodiment of the present invention.

In FIG. 2, reference numeral 31 denotes a battery group arranged as a high-voltage DC power supply (e.g., output voltage VB=200 to 300 V) and electrically insulated from a body of vehicle B.

Reference numeral 32 denotes an inverter for converting a DC voltage into an AC voltage, reference numeral 33 denotes a three-phase AC motor for vehicle traveling, reference numeral 34 denotes a plus bus serving as a DC positive electrode feeder extending from the battery group 31 to the inverter 32, reference numeral 35 denotes a minus bus serving as a DC negative electrode feeder extending from the battery group 31 to the inverter 32, reference numerals 36, 37, and 38 denote a U-phase line, a V-phase line, a W-phase line, respectively.

The ground detection apparatus 30 according to the embodiment has a microcomputer 1 incorporating CPU 26, RAM 25, ROM 27, and a square wave generator 14 for outputting a ground detection signal of a square wave having a period 2T, a detection resistor 3 connected to the microcomputer 1, a coupling capacitor 4 to which a connection point between the coupling capacitor 4 and the detection resistor 3 is connected as a ground detection point A, an A/D (analog/digital) input unit 11, arranged in the microcomputer 1 and connected to the ground detection point A by a connection line 5, for performing repeated sampling voltages of the ground detection point A every sampling period T to measure the voltages, one pair of zener diodes 22 connected between a resistor 21 connected between the A/D converter 11 and a ground detection point A, the A/D converter 11, and the ground, and a warning signal line 6 which is guided from a warning signal output unit 12 arranged in the microcomputer 1 and which is connected to an output terminal 13. The output terminal 13 is connected to an attention lamp 15 and a warning lamp 16.

The other connection terminal of the coupling capacitor 4 is connected to the plus bus 34 of the high-voltage DC power supply 31.

In the microcomputer 1 described above, voltage amplitude-insulation resistance corresponding data (to be described later) representing the relationship between a voltage amplitude and an insulation resistance, ground decision threshold values of a plurality of levels for deciding ground of the high-voltage DC power supply 31, and an abnormality decision threshold value $R_{ck}$ for deciding an abnormal waveform of the ground detection signal of the square wave are set and stored in a memory (ROM 27).

Figure 3:
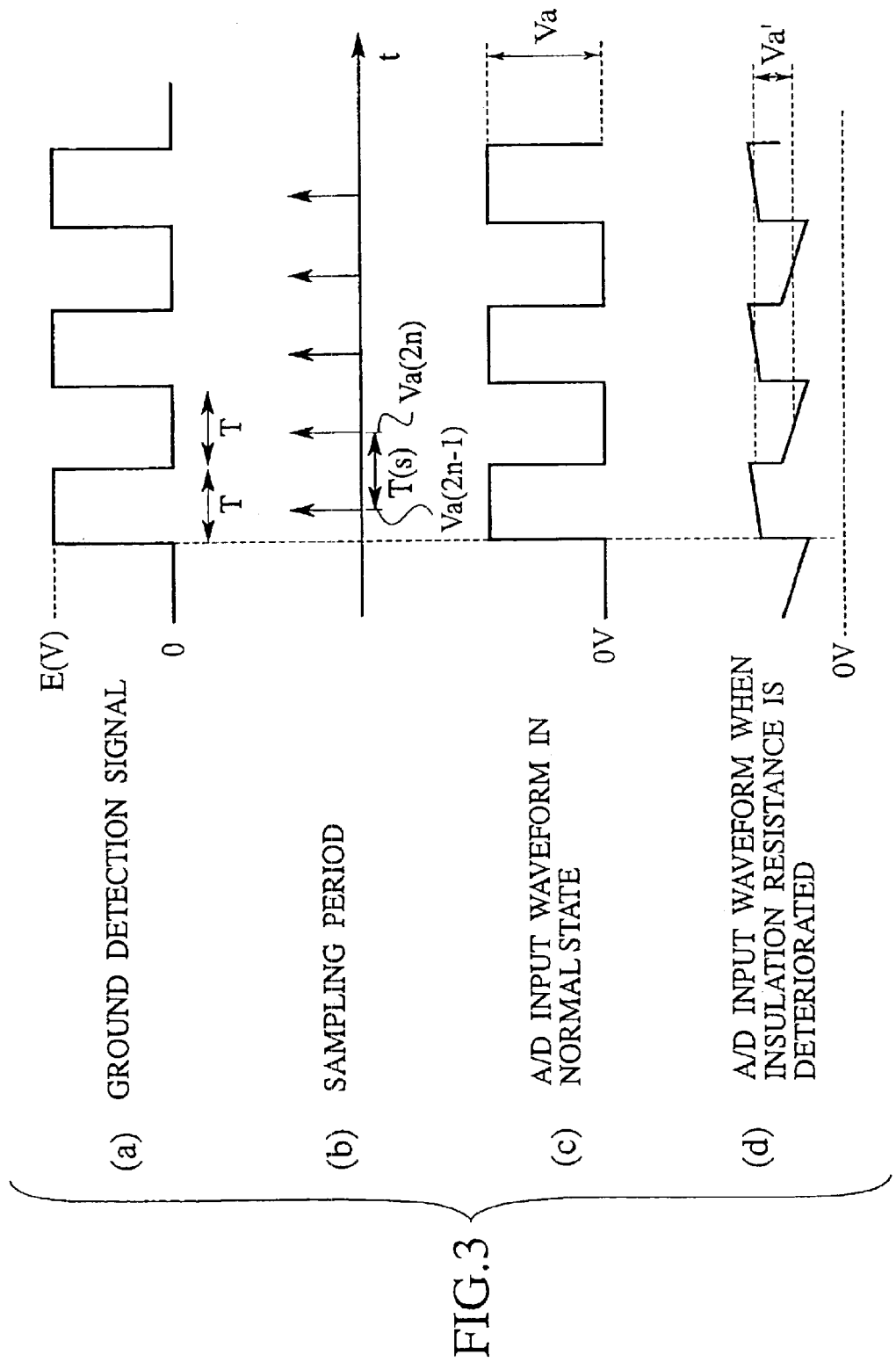
FIG. 3 is timing chart showing a ground detection signal (a), a sampling period (b), and the characteristics of A/D input waveforms in normal (c) and abnormal states (d) in one embodiment of the present invention.

As shown in FIG. 3, the ground detection signal constituting a square waveform, a sampling period T obtained by the A/D converter 11, and the relationship between an input voltage to the A/D converter 11 in a normal state and an input voltage to the A/D converter 11 in a state of insulation resistance deterioration caused by ground generation in the high-voltage DC power supply 31 will be described below.

The ground detection signal of the square wave forms a waveform constituted by one period of 2T comprising of, as one T an odd-numbered term Ti (i=2n−1) having a voltage E(V) and as the other T an even-numbered term Tj (j=2n) having a voltage of 0V. In this case, reference numeral n denotes a positive integer (1, 2, 3, . . . ).

The A/D converter 11, as shown in FIG. 3(b), sequentially performs repeated sampling of voltages of the ground detection point A at time intervals from the halfway point of the period T with the odd-numbered term Ti to the halfway point of the period T with the even-numbered term Tj, to be equivalent to a period T on the basis of control of the microcomputer 1 and the sampled data is temporarily stored in a storage such as RAM 25.

The input voltage to the A/D converter 11 in the normal state is a voltage amplitude Va having a waveform similar to the waveform (FIG. 3(a)) of the ground detection signal of the square wave as shown in FIG. 3(c) because an insulation resistance is deteriorated by ground generation in the high-voltage DC power supply 31.

On the other hand, when ground is generated in the high-voltage DC power supply 31, a voltage amplitude Va' which is an input voltage of the A/D converter 11 as shown in FIG. 3(d), is smaller than a value Va obtained in a normal state (Va>Va') because the voltage of the ground detection point A changes by a partial voltage of the detection resistor 3 and an insulation resistor 20 (insulation resistance RL) between the detection resistor 3 and the ground.

Figure 6:
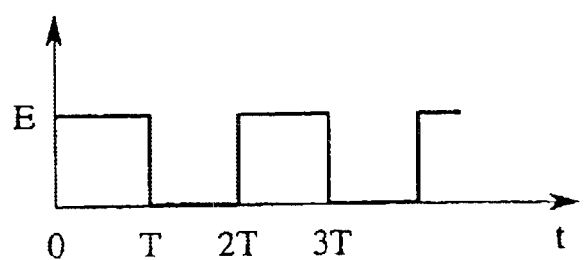
FIG. 6 is a waveform chart of a ground detection signal according to one embodiment of the present invention.

A case in which the insulation resistance is deteriorated by generation of ground on the anode side of the high-voltage DC power supply 31 will be described below with reference to the equivalent circuit diagram of the ground detection apparatus 30 shown in FIG. 4 and the waveform chart of the ground detection signal shown in FIG. 6.

Figure 4:
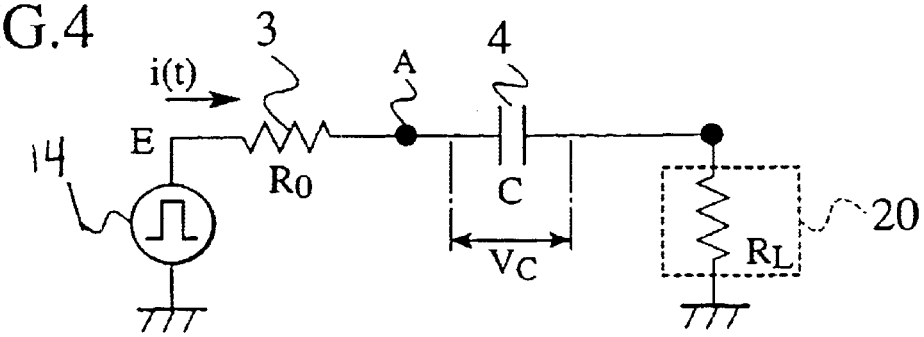
FIG. 4 is an equivalent circuit diagram of a ground detection apparatus when ground is generated on a positive electrode side of a high-voltage DC power supply according to one embodiment of the present invention.

In the equivalent circuit shown in FIG. 4, a current value of a ground detection signal is represented by i(t), the resistance of the detection resistor 3 by $R_0$, the insulation resistance of the insulation resistor 20 by $R_L$, the capacitance of the coupling capacitor 4, by C and the voltage of a ground detection signal output from the square wave generator 14 by E, respectively.

A voltage Va1 (2n−1) of the ground detection signal subjected to sampling in a section of the odd-numbered term Ti{0≦t≦T} is calculated. In this case, as is apparent from FIG. 4, the following Equation (1) is obtained.

$$\frac{1}{C}\int i dt + (R_0 + R_L)i = E \quad (\text{eq. 1})$$

Equation (1) is solved by using Laplace transform, the current value i(t) of the ground detection signal is given by the following Equation (2).

$$i(t) = \frac{E}{R_0 + R_L} e^{\frac{t}{C(R_0+R_L)}} \quad (\text{eq. 2})$$

Therefore, a voltage $Va_1(2n-1)$ of a ground detection signal having a square waveform subjected to sampling in a section of the odd-numbered term Ti{0≦t≦T} can be calculated for time duration of 0≦t≦T by Equation (3).

$$Va_{1(2n-1)} = E - R_0 i(t) = E\left(1 - \frac{R_0}{R_0 + R_L} e^{\frac{t}{C(R_0+R_L)}}\right) \quad (\text{eq. 3})$$

In this manner, voltage amplitude-insulation resistance relationship in the odd-numbered term Ti can be obtained.

A voltage $Va_2(2n)$ subjected to sampling in a section of the even-numbered term Tj is calculated for time variation of T≦t≦2T. In this case, with respect to a voltage initial value $Va_2(t=T)$ at an initial point of time in a section of the even-numbered term Tj, a charge accumulated in a coupling capacitor is calculated by using Equation (2), so that Equation (4) can be obtained with respect to a voltage Vc(t=T) generated across both the ends of the coupling capacitor.

$$V_{C(t=T)} = \frac{1}{C}\left[\int i dt\right]_{t=T} = E\left(1 - e^{\frac{T}{C(R_0+R_L)}}\right) \quad (\text{eq. 4})$$

Therefore, according to Equation (1), $i(t=T)=-Vc(t=T)/(R_0+R_L)$ is satisfied, and the current value i(t) of the ground detection signal can be calculated by Equation (5).

$$i(t) = -\frac{E}{R_0 + R_L}\left(1 - e^{\frac{T}{C(R_0+R_L)}}\right) e^{\frac{t-T}{C(R_0-R_L)}} \quad (\text{eq. 5})$$

Therefore, a voltage $Va_2(2n)$ subjected to sampling in a section of the even-numbered term Tj can be calculated for duration of T≦t≦2T by Equation (6).

$$Va_{2(2n)} = 0 - R_0 i(t) = \frac{R_0}{R_0 + R_L} E\left(1 - e^{\frac{T}{C(R_0+R_L)}}\right) e^{\frac{t-T}{C(R_0+R_L)}} \quad (\text{eq. 6})$$

In this manner, voltage amplitude-insulation resistance relationship in the even-numbered term Tj{T≦t≦2T} can be obtained.

Figure 5:
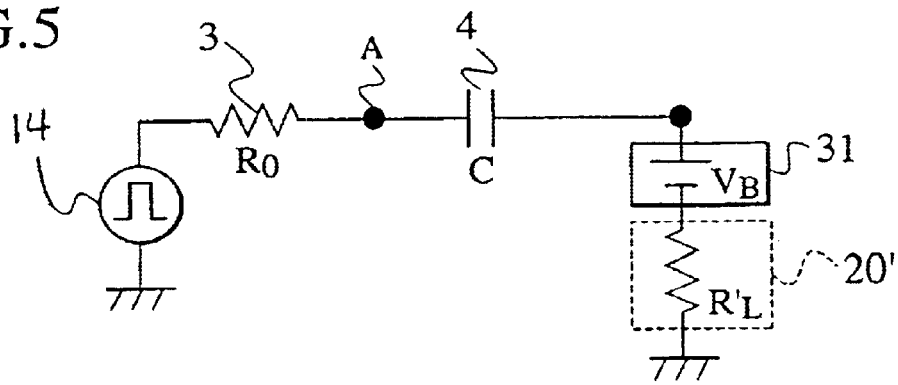
FIG. 5 is an equivalent circuit diagram of a ground detection apparatus when ground is generated on a negative electrode side of a high-voltage DC power supply according to one embodiment of the present invention.

A case in which an insulation resistance is deteriorated by generation of ground on the ground side of the high-voltage DC power supply 31 will be described with reference to the equivalent circuit diagram in FIG. 5 and the waveform chart in FIG. 6.

A voltage $Va_1'(2n-1)$ subjected to sampling in a section of the odd-numbered term Ti{0≦t≦T} is calculated. In this case, as shown in FIG. 5, when it is considered that E=0 represents a stationary state while t≦0, a coupling capacitor C has an impedance which is considerably larger than the resistances $R_0$ and $R'_L$. For this reason, a voltage $V_B$ may be almost entirely applied to the coupling capacitor C, therefore, Equation (7) is satisfied.

$$\frac{1}{C}\int i dt + (R_0 + R'_L)i = E - V_B \quad \text{(eq. 7)}$$

In Equation (7), reference symbol $V_B$ denotes an initial (t=0) voltage value of the coupling capacitor 4. At this time, charges $+V_B C$ and $-V_B C$ are accumulated in both the poles of the coupling capacitor C, respectively. Equation (7) is solved by using Laplace transform with respect to the current value i(t) of a ground detection signal, Equation (8) can be obtained.

$$i(t) = \frac{E}{R_0 + R'_L} e^{-\frac{t}{C(R_0 + R'_L)}} \quad \text{(eq. 8)}$$

Therefore, a voltage $Va_1'(2n-1)$ subjected to sampling in a section of the odd-numbered term Ti for duration of $0 \leq t \leq T$ can be calculated by Equation (9) which is the same as Equation (3).

$$Va'_{1(2n-1)} = E - R_0 i(t) = E\left(1 - \frac{R_0}{R_0 + R'_L} e^{-\frac{t}{C(R_0 + R'_L)}}\right) \quad \text{(eq. 9)}$$

A voltage $Va_2'(2n)$ subjected to sampling in a section of the even-numbered term Tj for $\{T \leq t \leq 2T\}$ is calculated. In this case, Equation (10) is established with respect to an initial point of time in the section of the even-numbered term Tj for duration of $T \leq t \leq 2T$.

$$\frac{1}{C}\int i dt + (R_0 + R'_L)i = 0 - V_B \quad \text{(eq. 10)}$$

When Equation (10) is solved by using Laplace transform with respect to the current value i(t) of the ground detection signal, Equation (11) can be obtained.

$$i(t) = -\frac{E}{R_0 + R'_L}\left(1 - e^{-\frac{T}{C(R_0 + R'_L)}}\right) e^{-\frac{t-T}{C(R_0 + R'_L)}} \quad \text{(eq. 11)}$$

Therefore, a voltage $Va_2'(2n)$ subjected to sampling in a section of the even-numbered term $Tj\{T \leq t \leq 2T\}$ can be calculated by Equation (12) which is the same form as Equation (6).

$$Va'_{2(2n)} = 0 - R_0 i(t)$$
$$= \frac{R_0}{R_0 + R'_L} E\left(1 - e^{-\frac{T}{C(R_0 + R'_L)}}\right) e^{-\frac{t-T}{C(R_0 + R'_L)}} \quad \text{(eq. 12)}$$

Procedure for detecting deterioration of the insulation resistor 20 (insulation resistance $R_L$) of the high-voltage DC power supply 31 on the basis of the voltages $Va_1$ and $Va_2$ (or the voltages $Va_1'$ and $Va_2'$) obtained as described above will be described below.

(A) Case in which deterioration of insulation resistance does not occur in the high-voltage DC power supply 31

In this case, the insulation resistance $R_L$ of the insulation resistor 20 is infinite, and, in a section in which a voltage output from the square wave generator 14 is E (V), Equation (13) is established according to Equation (3) with respect to the voltage $Va_1$.

$$Va_1 = E\left(1 - \frac{R_0}{R_0 + R_L} e^{-\frac{t}{C(R_0 + R'_L)}}\right) \quad \text{(eq. 13)}$$

In this case, since the insulation resistance $R_L$ is infinite, it can be estimated such that $R_0/R_L \ll 1$, and the exponential term of the second term in parentheses of the right side can be estimated by Equation (14).

$$\exp\left(-\frac{t}{C(R_0 + R_L)}\right) \cong 1 \quad \text{(eq. 14)}$$

Therefore, in this case, a voltage $Va_1$ of the ground detection point A can be expressed by Equation (15).

$$Va_1 \cong E(1 - 0 \times 1) = E \quad \text{(eq. 15)}$$

On the other hand, in a section in which a voltage output from the square wave generator 14 is 0 (V), a voltage $Va_2$ of the ground detection point A can be expressed by Equation (16) according to Equation (6).

$$Va_2 = \frac{R_0}{R_0 + R_L} E\left(1 - e^{-\frac{T}{C(R_0 + R_L)}}\right) e^{-\frac{t-T}{C(R_0 + R_L)}} \quad \text{(eq. 16)}$$

In this case, since the insulation resistance $R_L$ is infinite, Equation (17) is satisfied with respect to the respective elements of the right hand of Equation (16).

$$Va_2 = 0 \left(\because e^{\frac{T}{C(R_0 + R_L)}} \cong 1\right) \quad \text{(eq. 17)}$$

Therefore, a voltage (absolute-value voltage) Va of the ground detection point at this time can be expressed by Equation (18) on the basis of Equations (15) and (17).

$$Va = Va_1 - Va_2 = E - 0 = E(V) \quad \text{(eq. 18)}$$

(B) Case in which deterioration of insulation resistance occurs in high-voltage DC power supply 31

In this case, an insulation resistance $R_{L'}$ of a insulation resistor 20' satisfies $R_{L'} > 0$, the voltage Va of the ground detection point A establishes Equation (19) according to Equation (9) and Equation (12) with respect to a section in which a voltage output from the square wave generator 14 is E (V) and a section in which the voltage output from the square wave generator 14 is 0 (V). Here, $0 \leq t_1 \leq T$ and $T \leq t_2 \leq 2T$ are satisfied.

$$Va = Va'_1 - Va'_2 = E\left\{\left(1 - \frac{R_0}{R_0 + R'_L} e^{-\frac{t_1}{C(R_0 + R'_L)}}\right) - \frac{R_0}{R_0 + R'_L}\left(1 - e^{-\frac{T}{C(R_0 + R'_L)}}\right) e^{-\frac{t_2 - T}{C(R_0 + R'_L)}}\right\} \quad \text{(eq. 19)}$$

When sampling is performed at equal intervals T, $t_1$ and $t_2$ can be given as $t_1 = 0 + t$ and $t_2 = T + t$. For this reason, Equation (19') can be obtained.

$$Va = E\left\{1 - 2\frac{R_0}{R_0 + R'_L}e^{-\frac{t}{C(R_0+R'_L)}} + \frac{R_0}{R_0 + R'_L}e^{-\frac{T+t}{C(R_0+R'_L)}}\right\} \quad \text{(eq. 19')}$$

(C) Case in which high-voltage DC power supply 31 is short-circuited to body B

In this case, the insulation resistance $R_L$ of the insulation resistor 20 is given by $R_L=0$. At this time, Equation (20) is established with respect to voltage Va.

$$Va = Va'_1 - Va'_2 = E\left\{\left(1 - e^{-\frac{t_1}{CR_0}}\right) - \left(1 - e^{-\frac{T}{CR_0}}\right)e^{-\frac{t_2-T}{CR_0}}\right\} \quad \text{(eq. 20)}$$

Therefore, Equation (20') can be obtained in the same manner as Equation (19').

$$Va = E\left\{1 - 2e^{-\frac{t}{CR_0}} + e^{-\frac{T+t}{CR_0}}\right\} \quad \text{(eq. 20')}$$

Ground Detection Operation

Figure 7:
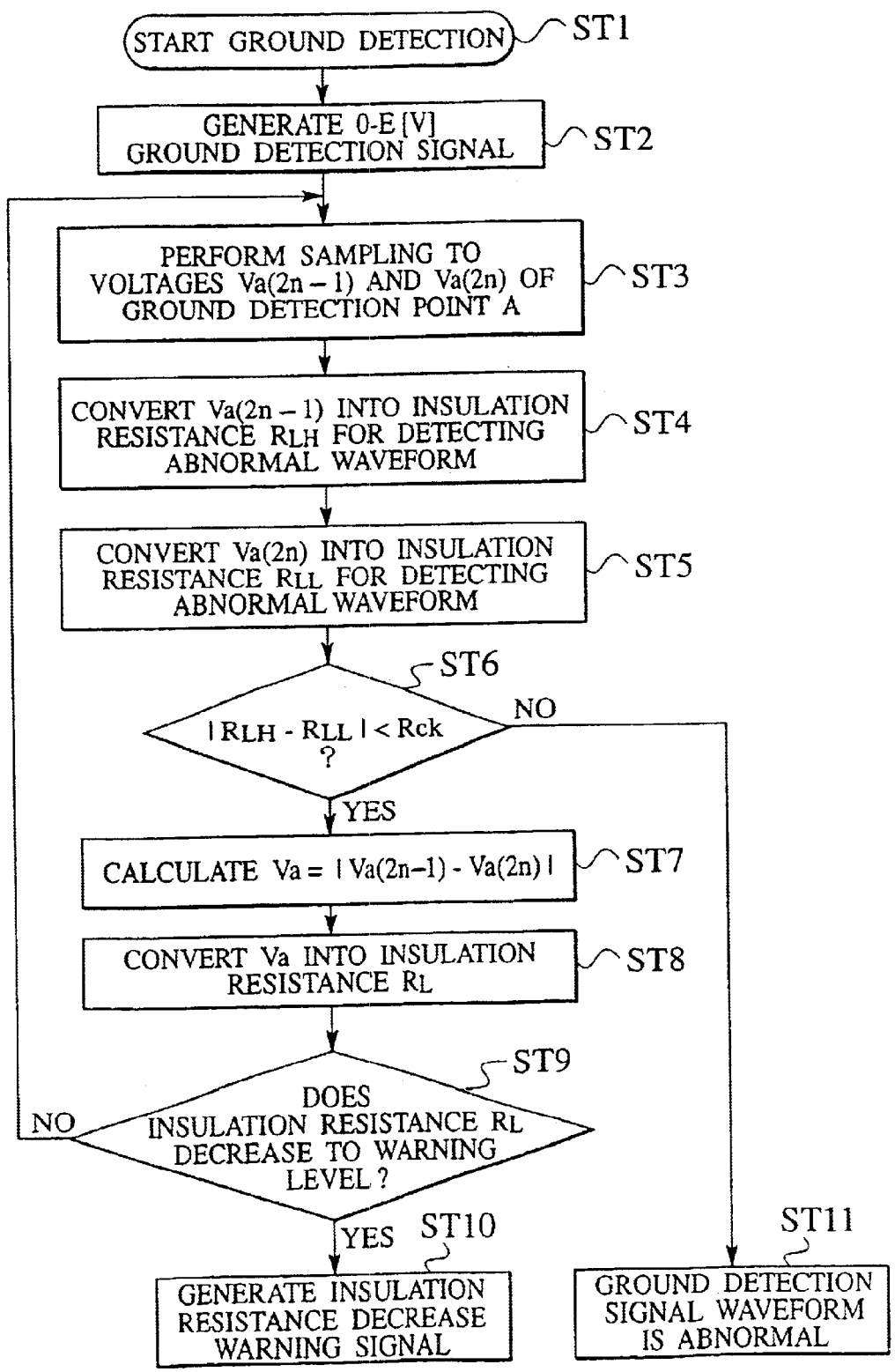
FIG. 7 is a flow chart showing the flow of a ground detection operation in the ground detection apparatus according to one embodiment of the present invention.

The flow of a ground detection operation of the high-voltage DC power supply 31 by the ground detection apparatus 30 according to the embodiment will be described below with reference to the flow chart shown in FIG. 7.

When the ground detection operation by the ground detection apparatus 30 is started (Step ST1), the square wave generator 14 oscillates a square wave of 0–E (V) (Step ST2) and supplies a ground detection signal to the high-voltage DC power supply 31 through the detection resistor 3 and the coupling capacitor 4.

In this manner, the microcomputer 1 performs sampling of a voltage Va of the ground detection point A at a timing synchronized with the period of the ground detection signal from the A/D converter 11 connected to the ground detection point A. More specifically, sampling is performed to voltage amplitude Va(2n−1) during the odd-numbered term and voltage amplitude Va(2n) during the even-numbered term (Step ST3).

The microcomputer 1 converts the voltage amplitude Va(2n−1) into an insulation resistance $R_{LH}$ for detecting an abnormal waveform on the basis of voltage amplitude voltage-insulation resistance corresponding data representing the relationship between a preset voltage amplitude and a preset insulation resistance (Step ST4).

More specifically, on the basis of a characteristic curve of voltage amplitude-insulation resistance relationship obtained by a relational expression indicated by Equation (3) (or Equation (9)), an optimized insulation resistance $R_L$ is calculated by substituting the voltage amplitude Va(2n−1) for the characteristic curve, and the resistance is represented by $R_{LH}$ (Step ST4).

Similarly, by substituting the voltage amplitude Va(2n) for the characteristic curve of the voltage amplitude-insulation resistance corresponding data obtained by the relational expression shown in Equation (6) (or Equation (12)), an optimized insulation resistance $R_L$ is calculated, and the resistance is represented by $R_{LL}$ (Step ST5).

The microcomputer 1 compares the absolute value of the difference between the converted insulation value $R_{LH}$ for detecting an abnormal waveform and the resistance $R_{LL}$ with the abnormality decision threshold value $R_{CK}$ (Step ST6). When the absolute value is larger than the abnormality decision threshold value $R_{CK}$ (NO in step ST6), it is decided that a ground detection signal waveform output from the microcomputer 1 has abnormality (Step ST11).

On the other hand, when the absolute value is smaller than the abnormality decision threshold value $R_{CK}$ (YES in step ST6), on the basis of the voltage amplitude Va(2n−1) and the voltage amplitude Va(2n) which are calculated in steps ST4 and ST5, the microcomputer 1 calculates an absolute-value voltage (voltage amplitude) Va of the difference between these amplitudes (Step ST7). In addition, the voltage Va is converted into the insulation resistance $R_L$ on the basis of voltage amplitude—insulation resistance corresponding data representing the relationship a preset voltage amplitude and a preset insulation resistance (Step ST8).

More specifically, a characteristic curve representing the relationship between the insulation resistance $R_L$ and the absolute-value voltage Va obtained by Equation (19) described above is formed, and the absolute-value voltage Va calculated in step ST7 is substituted for the characteristic curve, so that an optimized insulation resistance $R_L$ is calculated. It is apparent that another parameter fitting can be applied.

The microcomputer 1 compares the insulation resistance $R_L$ with a preset ground decision threshold value for ground decision of the high-voltage DC power supply 31 (Step ST9). When the insulation resistance $R_L$ decreases to the level of the ground decision threshold value (YES in step ST9), an insulation resistance decrease warning signal is sent to the terminal 13 through the warning signal line 6 (Step ST10). When the insulation resistance $R_L$ does not decrease to the level of the ground decision threshold value (NO in step ST9), the processes started from step ST3 are repeated. In this manner, when ground is generated in the high-voltage DC power supply 31, the ground can be immediately detected.

As described above, in the ground detection apparatus 30, sampling is performed to acquire a voltage generated at the ground detection point A in a sampling period T which is ½ the period 2T of a ground detection signal (square waveform signal). On the basis of the value of the difference between a voltage amplitude obtained by the odd-numbered sampling and a voltage amplitude obtained by the even-numbered sampling, the insulation resistance $R_L$ of the high-voltage DC power supply 31 is obtained. Therefore, since voltage amplitudes of the ground detection point are detected at predetermined intervals, the detection corresponds to that t is fixed in Equation (19'). For this reason, the voltage amplitude can be correctly specified. Therefore, according to the present invention, there can be provided a ground detection apparatus for vehicle which can detect the level of insulation resistance deterioration of the DC power supply circuit at a higher precision.

The insulation resistance $R_{LH}$ is calculated on the basis of the voltage amplitude Va(2n−1) obtained at the odd-numbered sampling, and the insulation resistance $R_{LL}$ is calculated on the voltage amplifier Va(2n) obtained at the even-numbered sampling. Since, by using the difference between the insulation resistance $R_{LH}$ and the insulation resistance $R_{LL}$, it can be detected whether abnormality occurs in the ground detection signal or not. For this reason, more reliable ground detection can be performed.

In addition, since the apparatus is designed such that a ground detection signal and a sampling pulse are outputted by using the microcomputer 1, the sampling pulse can be easily synchronized with the ground detection signal. Since a plurality of threshold values of a warning signal can be set, the number of warning signal lines can be reduced in comparison with the related art.

A concrete example of a ground detection operation of the high-voltage DC power supply 31 by the ground detection apparatus 30 according to the embodiment will be described below with reference to FIG. 8.

Figure 8:
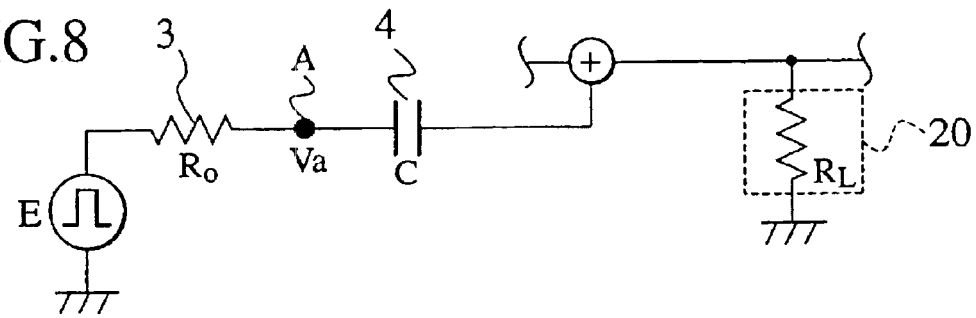
FIG. 8 is an equivalent circuit diagram for explaining a ground detection operation in the ground detection apparatus according to one embodiment of the present invention.

In the equivalent circuit shown in FIG. 8, it is assumed that a resistance of the detection resistor 3 is represented by $R_0$, that an insulation resistance of the insulation resistor 20 is given by $R_L$=43 kΩ, and that the capacitance C of the coupling capacitor 4=2.2 µF. It is assumed that the voltage E of the square wave generator 14 has a square waveform of 100 Hz, is 5 (V) in a section of the odd-numbered term Ti{0≦t≦T}, and is 0 (V) in a section of the odd-numbered term Tj{T≦t≦2T}.

A ground decision threshold value CA of an attention level is defined by 4.3 kΩ<$R_L$<30 kΩ, and a ground decision threshold value FA of a warning level is defined by $R_L$≦4.3 kΩ. In this state, the following description is performed.

Figure 9:
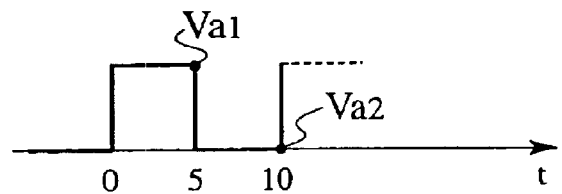
FIG. 9 is a chart explaining a voltage detection point of time when a sampling point of time in a normal state is not considered in the ground detection apparatus according to one embodiment of the present invention.

As shown in FIG. 9, when actual sampling time is not considered, the insulation resistance $R_L$ of the insulation resistance of the high-voltage DC power supply 31 is $R_L$=30 kΩ which is equal to the upper limit of the ground decision threshold value CA of the attention level, an absolute-value voltage Va which is the difference between a voltage amplitude Va1 and a voltage amplitude $Va_2$ which are calculated on the basis of Equation (3) and Equation (6) described above is 1.85 (V).

Figure 10:
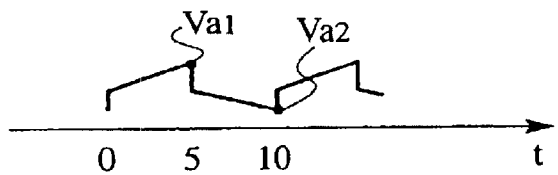
FIG. 10 is a chart explaining a voltage detection point of time when a sampling point of time in an abnormal state is not considered in the ground detection apparatus according to one embodiment of the present invention.

As shown in FIG. 10, when the actual sampling time is not considered, when the insulation resistance $R_L$ of the insulation resistance of the high-voltage DC power supply 31 decreases to 4.3 kΩ which is the ground decision threshold value FA of the warning level, the absolute-value voltage Va which is the difference between the voltage amplitude $Va_1$ and the voltage amplitude $Va_2$ which are calculated on the basis of Equation (3) and Equation (6) described above is 1.85 (V).

Figure 11:
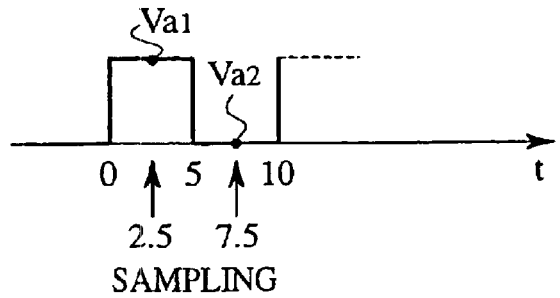
FIG. 11 is a chart explaining a voltage detection point of time when a sampling point of time in a normal state is considered in the ground detection apparatus according to one embodiment of the present invention.
Figure 12:
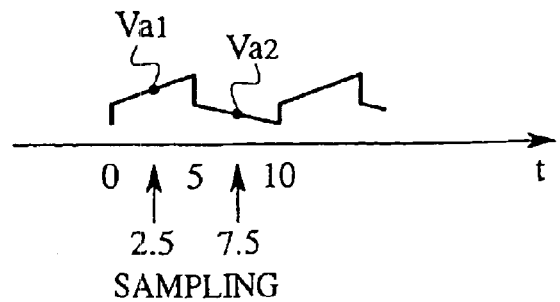
FIG. 12 is a chart explaining a voltage detection point of time when a sampling point of time in an abnormal state is considered in the ground detection apparatus according to one embodiment of the present invention.

As shown in FIGS. 11 and 12, a case in which the actual sampling time is considered will be described below. In this case, the insulation resistance $R_L$ of the insulation resistance of the high-voltage DC power supply 31 is $R_L$=30 kΩ which is equal to the upper limit of the ground decision threshold value CA of the attention level is 2.11 (V). The voltage amplitude $Va_2$ is 0.08 (V). Therefore, the absolute-value voltage Va which is the difference between the voltage amplitude Va1 and the voltage amplitude $Va_2$ is 2.03 (V).

When the actual sampling time is considered, and when the insulation resistance $R_L$ of the insulation resistance of the high-voltage DC power supply 31 decreases to 4.3 kΩ which is equal to the ground decision threshold value FA of the warning level, the voltage amplitude $Va_1$ is 0.55 (V). In addition, the voltage amplitude $Va_2$ is 0.21 (V).

Therefore, the absolute-value voltage Va which is the difference between the voltage amplitude $Va_1$ and the voltage amplitude $Va_2$ is 0.34 (V).

From the above results, when the absolute-value voltage $Va_0$ to be calculated is 2.0 (V) or less, a signal of an attention level is output from the warning signal line 6 to turn on, e.g., the attention lamp 15. When the absolute-value voltage $Va_0$ is 0.5 (V) or less, a signal of a warning level is output from the alarm signal line 6 to turn on the alarm lamp 16 and attention or warning is displayed.

This application claims benefit of priority under 35 USC §119 to Japanese Patent Applications No. 2001-004120, filed on Jan. 11, 2001, the entire contents of which are incorporated by reference herein. Although the invention has been described above by reference to certain embodiments of the invention, the invention is not limited to the embodiments described above. Modifications and variations of the embodiments described above will occur to those skilled in the art, in light of the teachings. The scope of the invention is defined with reference to the following claims.

What is claimed is:

1. A ground detection apparatus for electric vehicle having a DC power supply circuit which is electrically insulated from a body of vehicle, comprising:

a coupling capacitor which is connected to the DC power supply circuit;

a detection signal generator outputting a ground detection signal comprising a periodical waveform, the detection signal generator being connected to one terminal of the coupling capacitor through a detection resistor;

a signal detector detecting a voltage amplitude of the terminal of the coupling capacitor;

a converter converting the detected voltage amplitude into an insulation resistance on the basis of a predetermined relationship between a voltage amplitude and an insulation resistance and the resistance of the detection resistor; and a level detector detecting levels of insulation resistance deterioration of the DC power supply circuit by comparing the converted insulation resistance with a preset ground decision threshold value.

2. An apparatus according to, claim 1, wherein the signal detector performs sampling of the voltage amplitude at a predetermined period.

3. An apparatus according to claim 1, wherein:

the signal detector performs sampling of the voltage at a sampling period which is a half the period of the periodical waveform to detect the voltage; and a calculator calculates a difference between a first voltage detected by the odd-numbered sampling at the sampling period and a second voltage detected by the even-numbered sampling to acquire the voltage amplitude.

4. An apparatus according to claim 3, wherein the first voltage and the second voltage are converted into insulation resistances, respectively, and the difference between the converted resistances is compared with a preset abnormality decision threshold value to detect abnormality of the periodical waveform.

5. An apparatus according to claim 1, wherein the periodical waveform is a square waveform.

6. A ground detection method for electric vehicle having a DC power supply circuit which is electrically insulated from a body of vehicle, a terminal of a coupling capacitor being connected to the DC power supply circuit, comprising steps of:

outputting a ground detection signal comprising a periodical waveform through a resistor to the other terminal of the coupling capacitor;

detecting a voltage of the other terminal of the coupling capacitor;

converting the detected voltage amplitude into an insulation resistance on the basis of a predetermined relationship between a voltage amplitude and a insulation resistance and the resistance of the resistor; and detecting levels of insulation resistance deterioration of the DC power supply circuit by comparing the converted insulation resistance with a preset ground decision threshold value.

7. A method according to claim 6, wherein:

the signal detecting operation performs sampling of the voltage at a sampling period which is a half the period of the periodical waveform to detect the voltage; and the converting operation calculates a difference between a first voltage detected by the odd-numbered sampling at the sampling period and a second voltage detected by the even-numbered sampling to acquire the voltage amplitude.

8. A ground detection apparatus for electric vehicle having a DC power supply circuit which is electrically insulated from a body of vehicle, comprising:

coupling means which is connected to the DC power supply circuit;

output means for a ground detection signal comprising a periodical waveform, the output means being connected to one terminal of a coupling capacitor through a detection resistor;

signal detection means to detect a voltage amplitude of one terminal of the coupling capacitor;

conversion means to convert the detected voltage amplitude into an insulation resistance on the basis of a predetermined relationship between a voltage amplitude and a insulation resistance and the resistance of the detection resistor; and level detection means to detect levels of insulation resistance deterioration of the DC power supply circuit by comparing the converted insulation resistance with a preset ground decision threshold value.

* * * * *